(12) United States Patent
Pilo et al.

(10) Patent No.: US 12,340,865 B2
(45) Date of Patent: Jun. 24, 2025

(54) REDUCED CIRCUIT AREA MEMORY DEVICE WITH A HALF-WORD MEMORY ARCHITECTURE

(71) Applicant: Synopsys, Inc., Sunnyvale, CA (US)

(72) Inventors: Harold Pilo, Underhill, VT (US); Niranjan Behera, San Ramon, CA (US)

(73) Assignee: Synopsys, Inc., Sunnyvale, CA (US)

( * ) Notice: Subject to any disclaimer, the term of this patent is extended or adjusted under 35 U.S.C. 154(b) by 244 days.

(21) Appl. No.: 18/143,560

(22) Filed: May 4, 2023

(65) Prior Publication Data

US 2024/0371416 A1 Nov. 7, 2024

(51) Int. Cl.
*G11C 7/10* (2006.01)
*G11C 7/08* (2006.01)

(52) U.S. Cl.
CPC .............. *G11C 7/1012* (2013.01); *G11C 7/08* (2013.01); *G11C 7/1063* (2013.01); *G11C 7/1096* (2013.01)

(58) Field of Classification Search
CPC ................. G11C 7/1012; G11C 7/10
USPC ...................................... 365/189.11
See application file for complete search history.

(56) References Cited

U.S. PATENT DOCUMENTS

| 10,825,526 B1* | 11/2020 | Li ................... G11C 16/24 |
| 2003/0156442 A1* | 8/2003 | Origasa ................ G11C 5/06 257/E25.011 |
| 2010/0269022 A1* | 10/2010 | Clark .................. G06F 9/3867 714/764 |
| 2015/0254824 A1* | 9/2015 | Xu ....................... G06T 5/10 382/260 |

* cited by examiner

*Primary Examiner* — Muna A Techane
(74) *Attorney, Agent, or Firm* — Patterson + Sheridan, LLP

(57) ABSTRACT

A memory device includes a memory device and control circuitry. The memory array includes bitcells and bitlines connected to the bitcells. The bitcells are grouped into bitcell groups. The control circuitry is connected to the bitcell groups via the bitlines. The control circuitry adjusts connections with the bitcell groups to include a first bitcell group of the bitcell groups in memory operations and exclude a second bitcell group of the bitcell groups from the memory operations based on a half-word control signal being enabled.

20 Claims, 5 Drawing Sheets

REDUCED CIRCUIT AREA MEMORY DEVICE WITH A HALF-WORD MEMORY ARCHITECTURE

TECHNICAL FIELD

The present disclosure relates to a memory device that performs half-word memory operations, and supports column redundancy repair across different input/output segments controlled by different half-word control signals.

BACKGROUND

A memory device has a half-word architecture that supports both read and write memory operations. In a half-word architecture, bitcell columns, write driver circuits, sense amplifier circuits, and input/output circuits of the memory device are partitioned into different segments (e.g., a left segment and a right segments) that are controlled by different bits of a half-word control signal (e.g., different bits of the control signal HW<0:1>). Enabling one of the segments allows for a read or write memory operation to be performed with the associated bitcells while the bitcells associated with the disabled segment are not affected. Half-word memory devices implement column redundancy (or column repair) to account for faults detected during testing. A redundant column and corresponding circuitry are added to each of the left and right segments. The redundant column and corresponding circuitry associated with the left segment is used to address faults within the columns of the left segment, and the redundant column and corresponding circuitry associated with the right segment is used to address faults within the columns of the right segment.

SUMMARY

In one example, a memory device includes a memory device and control circuitry. The memory array includes bitcells and bitlines connected to the bitcells. The bitcells are grouped into bitcell groups. The control circuitry is connected to the bitcell groups via the bitlines. The control circuitry adjusts connections with the bitcell groups to include a first bitcell group of the bitcell groups in memory operations and exclude a second bitcell group of the bitcell groups from the memory operations based on a half-word control signal being enabled.

In one example, control circuitry includes shift control circuitry configured. The shift control circuitry, based on a half-word control signal being enabled, adjusts connections between the control circuitry and bitcells groups of a memory array to include a first bitcell group of the bitcell groups in memory operations and exclude a second bitcell group of the bitcell groups from the memory operations. The memory array comprises bitlines connected to bitcells of the bitcells groups.

In one example, a memory device includes a memory array and control circuitry. The memory includes bitcells and bitlines connected to the bitcells. The control circuitry is connected the memory array. The control circuitry includes write driver circuitry, sense amplifier circuitry, shift control circuitry, and input/output circuitry. The write driver circuitry includes write drivers connected to the bitlines. The sense amplifier circuitry includes sense amplifiers. Each of the sense amplifiers is coupled to the bitlines, and receives data from the bitlines. The shift control circuitry includes first shift circuits and second shift circuits. The first shift circuits are connected to the write drivers. Each of the first shift circuits outputs write signals to two of the write drivers. The second shift circuits are connected to the sense amplifiers. The sense amplifiers are gated based on a half-word control signal to control outputting data signals to the second shift circuits. The input/output circuitry includes input/output circuits. Each input/output circuit is connected to a respective one of the first shift circuits. The output of each input/output circuit is gated based on the half-word control signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
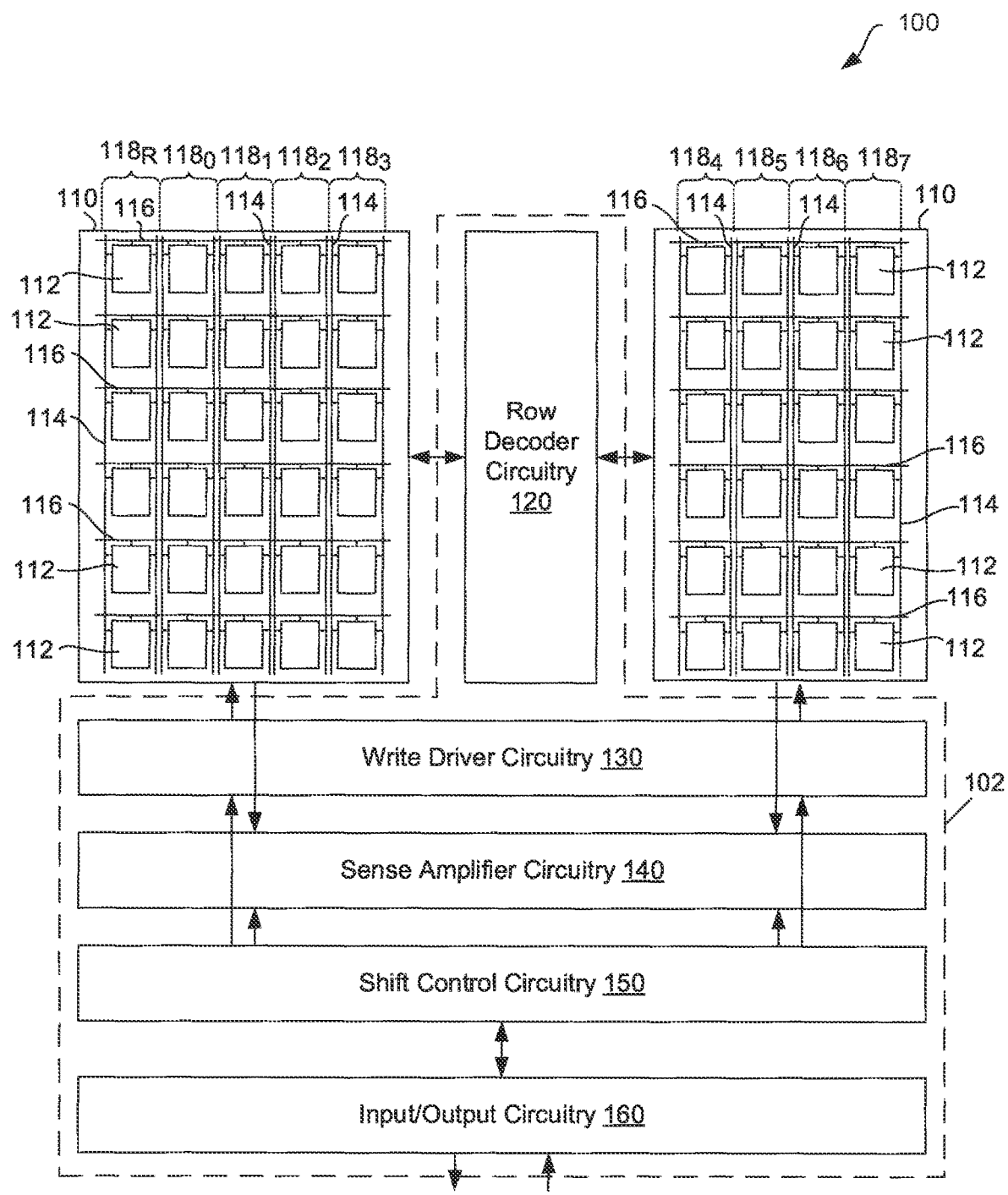
FIG. 1 illustrates a block diagram of a memory device in accordance with some embodiments of the present disclosure.

Aspects of the present disclosure relate to a reduced circuit area memory device with a half-word architecture. A memory device with a half-word architecture supports both read and write memory operations. A memory device includes bitcells arranged in columns, write driver circuits, sense amplifier circuits, and input/output circuits. The columns, write driver circuits, sense amplifier circuits, and input/output circuits are partitioned into different segments (e.g., a left segment and a right segments). The different segments are controlled by different bits of a half-word control signal (e.g., different bits of the control signal HW<0:1>) to allow for the read and write memory operations. Enabling one of the segments allows for a read or write memory operation to be performed with the associated bitcells while the bitcells associated with the disabled segment are not affected.

Memory devices with a half-word architecture implement column redundancy (or column repair) to account for faults detected during testing. The redundant column, or columns, may be used instead of a column that is determined to contain defected bitcells. For example, during manufacturing, a memory device is tested to detect defective bitcells. Based on the detection of defective bitcells, the redundant column is used. However, in a conventional memory device, a redundant column and corresponding circuitry are added to each of the left and right segments. The redundant column and corresponding circuitry associated with the left segment is used to address faults within the columns of the left segment, and the redundant column and corresponding circuitry associated with the right segment is used to address faults within the columns of the right segment. Further, wordline gating (e.g., gating of signal driven onto the wordlines of the memory device) is used to control the left and right segments. Accordingly, the circuit area and complexity of the memory device is increased, increasing the manufacturing cost of the corresponding memory device.

The memory device described herein has a half-word architecture that utilizes a single redundant column for column redundancy. The redundant column may be used instead of a defect column within the left or right segment. As is described in greater detail in the following, when performing a half-word read operation, the enable signal of the sense amplifiers of the memory device is gated based on the corresponding half-word control signal. Further, when performing a half-word write operation, the write data signals are gated based on the corresponding half-word control signal. Further, the memory device described herein steers (or shifts) data received from a sense amplifier from a column in the left segment to an Output in the right segment, and write signals from a write driver in the right segment to a column in the left steering when the redundant column is used.

In one example, a memory device is 32 bits, with 16 bits associated with a left segment and 16 bits associated with a right segment. In a conventional memory device to support redundancy in the left segment and the right segment, 2 bits are allocated for redundancy. However, using a single column for redundancy across the left segment and the right segment as described herein reduces the circuit area overhead of the corresponding memory device as only a 1 bit is used for column redundancy instead of 2 bits.

Technical advantages of the present disclosure include, but are not limited to, a memory device having a half-word architecture that supports the use of a single redundant column, reducing the circuit area and complexity of the corresponding memory device. As compared to a conventional memory device that incorporates multiple redundant columns (e.g., a redundant column for a left segment and a redundant column for a right segment), the memory device described herein uses a single redundant column and does not apply gating to the wordlines. Accordingly, the circuit area and complexity of the memory device describe herein is reduced, reducing the manufacturing cost of the memory device.

FIG. 1 illustrates a memory device 100, according to one or more examples. The memory device 100 may be a random access memory (RAM) device (e.g., a static RAM (SRAM) device or other types of RAM devices) or a register file memory device, among others. The memory device 100 includes one or more integrated circuit (IC) chips. In one or more examples, the memory device 100 is a system-on-chip (SoC) device. The memory device 100 includes control circuitry 102 and a memory array 110. The control circuitry 102 includes row decoder circuitry 120, write driver circuitry 130, sense amplifier circuitry 140, shift control circuitry 150, and input/output circuitry 160.

The memory array 110 includes bitcells 112, bitlines 114, and wordlines 116. Each bitcell 112 includes one or more transistors that are configured to store a voltage associated with a bit of data. Further, each bitcell 112 is coupled to a wordline 116 by one or more transistors, and to a pair of bitlines via one or more transistors. In one example, the bitcells 112 are arranged in rows and columns. A row of bitcells 112 refers to the bitcells 112 that are connected to a common wordline 116. A column of bitcells 112 refers to the bitcells 112 that are connected to a common pair of bitlines 114. While rows and columns may be used through this description, in other examples, the bitcells 112 may be arranged in other configurations. In one example, a wordline 116 is enabled (e.g., driven with a logic value of one) to select a bitcell or bitcells connected to the wordline for updating or to be read. Further, to update a selected bitcell 112, a corresponding pair of bitlines 114 is driven with respective voltages. To read from a selected bitcell 112, voltages are read from the selected bitcell 112 via a corresponding pair of bitlines 114. While FIG. 1 illustrates a configuration where each bitcell 112 is connected to a pair of bitlines 114 and a single wordline 116, in other examples, other configurations of bitcells 112, bitlines 114, and wordlines 116 are used. For example, a bitcell 112 may be connected to less than or more than two bitlines 114. Further, a bitcell 112 may be connected to more than one wordline 116.

The bitcells 112 are disposed in columns $118_R$-$118_7$. Each of the columns 118 includes the bitcells 112 that are connected to a pair of bitlines 114. The bitcells 112 of the column $118_R$ are used for redundancy. For example, during testing if bitcells 112 within one of the columns $118_0$-$118_7$ are determined to be defected, the column $118_R$ is used instead of the defected column. In other examples, a group of bitcells 112 other than that in a column may be used for redundancy.

The control circuitry 102 is connected to the memory array 110. In one example, the control circuitry 102 is connected to the bitcells 112 via bitlines 114 and wordlines 116. As is described in greater detail of the following, the control circuitry 102 adjusts connections with the columns 118 based on whether or not a half-word control signal is enabled. For example, adjusting the connections with the columns includes omitting one of the columns $118_1$-$118_7$ from being used for memory operations and using the column $118_0$ for memory operations. Using a column 118 for memory operations includes writing data to the column 118 and reading data from the column 118. In one example, one of the columns $118_1$-$118_7$ is determined to be defected during testing, and the defected column is omitted from being used for writing data to and reading data from (e.g., memory operations), and the column $118_0$ is used instead. The column $118_0$ is a redundancy column that is used for memory operations when errors are identified within another one of the columns $118_1$-$118_7$.

The row decoder circuitry 120 is connected to the memory array 110. For example, the row decoder circuitry 120 is connected to the wordlines 116. The row decoder circuitry 120 receives an address control signal, and decodes the address control signal to determine which wordline 116 is to be activated to select the corresponding bitcell 112. Further, the row decoder circuitry 120 enables (e.g., drives to a high voltage value or a low voltage value) the wordline to activate the wordline, selecting the corresponding bitcell 112.

The write driver circuitry 130 is connected to the memory array 110. For example, the write driver circuitry 130 is connected to the bitlines 114 and drives voltage signals onto the bitlines 114 to update a selected bitcell 112 or bitcells 112. For example, the write driver circuitry 130 receives an address control signal, and decodes the address control signal to determine which bitlines 114 to drive to update the selected bitcell 112 or bitcells 112. In one example, a selected bitcell 112 is connected to an activated wordline 116 and connected to a pair of driven bitlines 114. The write driver circuitry 130 drives voltages (e.g., write signals) onto the bitlines 114 of the selected bitcell 112 or bitcells 112 to update the selected bitcell 112 or bitcells 112. The driven voltages correspond to an input data signal or data signals.

The sense amplifier circuitry 140 is connected to the memory array 110. For example, the sense amplifier circuitry 140 is connected to the bitlines 114 and receives voltage signals (e.g., data signals) from the bitlines 114 to read a value (e.g., a data value) of a selected bitcell 112 or bitcells 112. For example, the sense amplifier circuitry 140 receives an address control signal, and decodes the address control signal to determine which bitlines 114 to read from to read a value of the selected bitcell 112 or bitcells 112. The sense amplifier circuitry 140 receives voltage signals from the bitlines 114 of the selected bitcell 112 or bitcells 112 to read a value of the selected bitcell 112 or bitcells 112.

The shift control circuitry 150 is connected to the write driver circuitry 130 and the sense amplifier circuitry 140. Further, the shift control circuitry 150 is connected to the input/output circuitry 160. As will be described in greater detail with regard to FIG. 2 and FIG. 4, the shift control circuitry 150 controls the connections between the bitcells 112 and the input/output circuitry 160. In one example, one of the columns $118_0$-$118_7$ is determined to include a defected bitcell 112 or bitcells 112. In such an example, the column $118_R$ is used instead of the column $118_0$-$118_7$ that is determined to include a defected bitcell 112 or bitcells 112. In an example where the column $118_R$ is used, the shift control circuitry 150 controls the connections between the input/output circuitry 160 and the bitcells 112 of the columns 118 to account for the defected column 118 not being used. The details and corresponding functionality of the shift control circuitry 150 is described in greater detail with regard to FIGS. 2 and 4.

The input/output circuitry 160 is connected to the shift control circuitry 150 and receives input data signals and outputs output data signal. The input data signals include data to be written to a selected bitcell or bitcells. The output data signals include data read from a selected bitcell or bitcells. In one example, the input/output circuitry 160 includes one or more inputs (e.g., input pins or pads and corresponding circuitry) that receive data signals and one or more outputs (e.g., output pins or pads and corresponding circuitry) that output data signals. In one example, a pin (or pad) is configured as an input/output pin that receives data signals and outputs data signals.

In one example, the memory device 100 is a half-word memory device. In such a configuration, a group of the columns 118 may be written to or read from while the other group of columns 118 is masked and unaffected. In one example a half-word control signal (e.g., HW<0:1>) is used to control which group of columns 118 is enabled when performing a half-word read or write memory operation.

Figure 2:
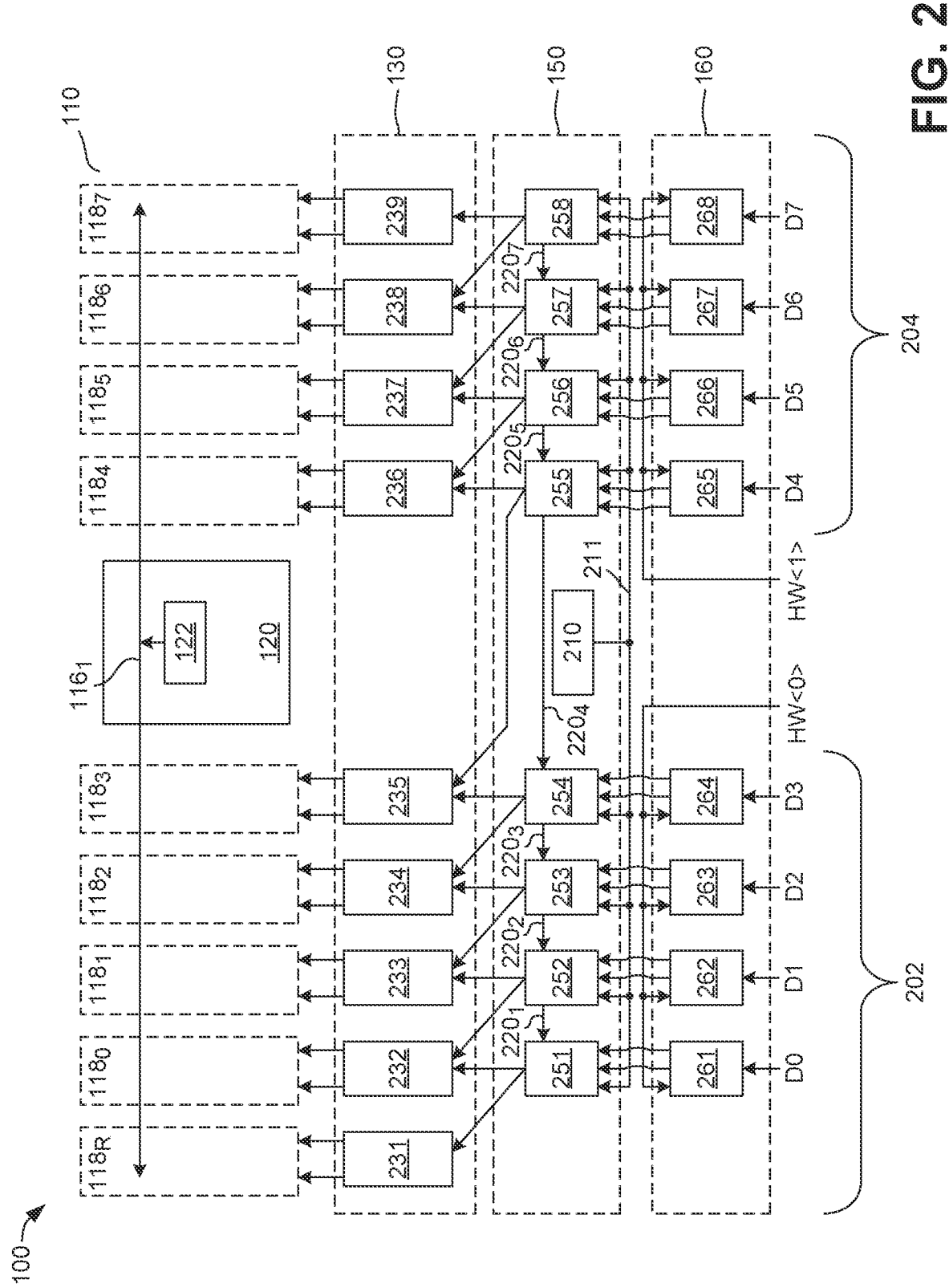
FIG. 2 illustrates a block diagram of a memory device in accordance with some embodiments of the present disclosure.

FIG. 2 illustrates a block diagram of the memory device 100 including the memory array 110, the write driver circuitry 130, the shift control circuitry 150, and the input/output circuitry 160. The write driver circuitry 130 includes write drivers 231-239. The write drivers 231-239 are connected to the columns 118. Each write driver is selectively coupled to one of the columns 118. For example, the write driver 231 is connected to the column $118_R$, the write driver 232 is connected to the column $118_0$, the write driver 233 is connected to the column $118_1$, the write driver 234 is connected to the column $118_2$, the write driver 235 is connected to the column $118_3$, the write driver 236 is connected to the column $118_4$, the write driver 237 is connected to the column $118_5$, the write driver 238 is connected to the column $118_6$, and the write driver 239 is connected to the column $118_7$. In such an example, each write driver 231-239 is connected to the corresponding pair of bitlines 114 associated with each column 118, and drives voltages onto the corresponding pair of bitlines 114 to update the selected bitcell 112 or bitcells 112.

The shift control circuitry 150 includes shift circuits 251-258. Each shift circuit 251-258 is connected to at least two of the write drivers 231-239. In one example, each shift circuit 251-258 is connected to two adjacent write drivers 231-239. For example, the shift circuit 251 is connected to the write drivers 231 and 232, the shift circuit 252 is connected to the write drivers 232 and 233, the shift circuit 253 is connected to the write drivers 233 and 234, the shift circuit 254 is connected to the write drivers 234 and 235, the shift circuit 255 is connected to the write drivers 235 and 236, the shift circuit 256 is connected to the write drivers 235 and 237, the shift circuit 257 is connected to the write drivers 237 and 238, and the shift circuit 258 is connected to the write drivers 238 and 239.

Each shift circuit 251-258 is connected to an input/output circuit 261-268 of the input/output circuitry 160. Each of the input/output circuits 261-268 receives a respective data signal D0-D7, generates write signals from the data signal, and outputs the write signals to the shift circuits 251-258. Each of the shift circuits 251-258 output the write signals to a corresponding one of the write drivers 231-239 based on whether or not a defected column has been detected and the redundant column $118_R$ is being used.

The write drivers 231-235, the shift circuits 251-254, and the input/output circuits 261-264 are associated with segment 202. The segment 202 may be referred to a first group or a left-hand segment.

The input/output circuits 261-264 receive the control signal HW<0>. The control signal HW<0> enables or disables the input/output circuits 261-264. For example, based on the control signal HW<0> having a first value (e.g., a first one of a logic value of 1 or a logic value of 0), the input/output circuits 261-264 are enabled, and based on the control signal HW<0> having a second value (e.g., the other one of a logic value of 1 or a logic value of 0), the input/output circuits 261-264 are disabled. When the input/output circuits 261-264 are enabled, the input/output circuits 261-264 output write signals to the shift circuits 251-254 based on the corresponding data signals D0-D3. When the input/output circuits 261-264 are not enabled (e.g., disabled), the input/output circuits 261-264 do not output the write signals. The input/output circuits 261-264 are enabled and disabled as a group. Accordingly, the corresponding columns 118 can be masked off and unaffected when other columns are updated or read from.

The write drivers 236-239, the shift circuits 255-258, and the input/output circuits 265-268 are associated with segment 204. The segment 204 may be referred to a second group or a right-hand segment.

The input/output circuits 265-268 receive the control signal HW<1>. The control signal HW<1> enables or disables the input/output circuits 265-268. For example, based on the control signal HW<1> having a first value (e.g., a first one of a logic value of 1 or a logic value of 0), the input/output circuits 265-268 are enabled, and based on the control signal HW<1> having a second value (e.g., the other one of a logic value of 1 or a logic value of 0), the input/output circuits 265-268 are disabled. When the input/output circuits 265-268 are enabled, the input/output circuits 265-268 output write signals to the shift circuits 255-258 based on the corresponding data signals D4-D7. When the input/output circuits 265-268 are not enabled (e.g., disabled), the input/output circuits 265-268 do not output the write signals. The input/output circuits 265-268 are enabled and disabled as a group. Accordingly, the corresponding columns 118 can be masked off and unaffected when other columns are updated or read from.

In one example, the control signals HW<0> and HW<1> are bits of the control signal HW<0:1>.

In each segment 202 and 204, each shift circuit 251-258 is connected to an adjacent shift circuit or shift circuits. In the segment 202 the shift circuit 254 is connected to the shift circuit 253, the shift circuit 253 is connected to the shift circuit 252, and the shift circuit 252 is connected to the shift circuit 251. In the segment 204 the shift circuit 258 is connected to the shift circuit 257, the shift circuit 257 is connected to the shift circuit 256, and the shift circuit 256 is connected to the shift circuit 255. Further, the shift circuit 255 is connected to the shift circuit 254, such that shift circuits of the segments 202 and 204 are connected to each other. In one example, the interconnections between shift circuits 251-258 are used to communicate shift control signals 220 between the shift circuits 251-258. The shift control signals 220 instruct the shift circuits 251-258 which write driver to send write signals.

The shift control signals 220 instruct the receiving shift circuit which write driver 231-239 to output write signals. For example, the shift control signal $220_7$ instructs the shift circuit 257 to output the write signals to either the write driver 237 or 238. The shift control signal $220_6$ instructs the shift circuit 256 to output the write signals to either the write driver 236 or 237. The shift control signal $220_5$ instructs the shift circuit 255 to output the write signals to either the write driver 235 or 236. The shift control signal $220_4$ instructs the shift circuit 254 to output the write signals to either the write driver 234 or 235. The shift control signal $220_3$ instructs the shift circuit 253 to output the write signals to either the write driver 233 or 234. The shift control signal $220_2$ instructs the shift circuit 252 to output the write signals to either the write driver 232 or 233. The shift control signal $220_1$ instructs the shift circuit 251 to output the write signals to either the write driver 231 or 232.

Each shift circuits 251-258 receive the control signal 211 from the decoder circuitry 210. The decoder circuitry 210 generates the control signal 211 with an indication as to which column 118 is defective and which shift circuit 251-258 is to shift to outputting write signals to a different write driver. The decoder circuitry 210 is connected to each of the shift circuits 251-258, and provides a common control signal (e.g., the control signal 211) to each of the shift circuits 251-258.

In one example, the defective column is determined during testing and an indication as to which column is defective is stored within a memory or register file. The decoder circuitry 210 accesses the memory and generates the control signal 211 based on the defective column. In one example, the control signal 211 is a multi-bit signal. The bit values within the control signal 211 indicate which shift circuit 251-258 is to shift the outputting of the write signals between corresponding write drivers. The indicated shift circuit is the first shift circuit that output shifting is applied, and the downstream shift circuits are controlled via the shift control signals 220. Each of the shift circuits 251-258 is associated with a different bit value within the control signal 211. The bit value identifies which shift circuit is to use an output shift operation.

In one example, the column $118_6$ is determined to be defective (e.g., include a defective bitcell or bitcells) during testing, and a corresponding indication is stored within a memory and/or within the decoder circuitry 210. The decoder circuitry 210 generates and outputs the control signal 211 to the shift circuits 251-257 indicating that the shift circuit 257 is to shift outputting write signals from the write driver 238 to the write driver 237. The shift circuit 258 continues to output write signals to the write driver 239. Accordingly, the column $118_6$ is not used.

The shift circuit 257 receives the control signal 211 and determines from the bit values of the control signal 211 to shift outputting write signals from the write driver 238 to the write driver 237. The shift circuit 257 outputs the shift control signal $220_6$ having an indication for the shift circuit 256 to shift outputting write signals from the write driver 237 to the write driver 236. In one example, the shift circuit 257 sets the shift control signal $220_6$ to a logic value of 0 or 1 to provide an indication for the shift circuit 256 to shift outputting the write signals from the write driver 237 to the write driver 238. Based on the shift control signal $220_6$ including an indication to perform the output shift operation, the shift circuit 256 shifts from outputting write signals to the write driver 237 to the write driver 236 and sets the shift control signal $220_5$ to a logic value of 0 or 1 to provide an indication for the shift circuit 255 to shift outputting the write signals from the write driver 236 to the write driver 235. Based on the shift control signal $220_5$ including an indication to perform the output shift operation, the shift circuit 255 shifts from outputting write signals to the write driver 236 to the write driver 235, and sets the shift control signal $220_4$ to a logic value of 0 or 1 to provide an indication for the shift circuit 254 to shift outputting the write signals from the write driver 235 to the write driver 234. Based on the shift control signal $220_4$ including an indication to perform the output shift operation, the shift circuit 254 shifts from outputting write signals to the write driver 235 to the write driver 234 and sets the shift control signal $220_3$ to a logic value of 0 or 1 to provide an indication for the shift circuit 253 to shift outputting the write signals from the write driver 234 to the write driver 233. Based on the shift control signal $220_3$ including an indication to perform the output shift operation, the shift circuit 253 shifts from outputting write signals to the write driver 234 to the write driver 233, and sets the shift control signal $220_2$ to a logic value of 0 or 1 to provide an indication for the shift circuit 252 to shift outputting the write signals from the write driver 233 to the write driver 232. Based on the shift control signal $220_2$ including an indication to perform the output shift operation, the shift circuit 252 shifts from outputting write signals to the write driver 233 to the write driver 232, and sets the shift control signal $220_1$ to a logic value of 0 or 1 to provide an indication for the shift circuit 251 to shift outputting the write signals from the write driver 232 to the write driver 233. Based on the shift control signal $220_1$ including an indication to perform the output shift operation, the shift circuit 251 shifts from outputting write signals to the write driver 232 to the write driver 231.

In the above example, the shift circuit 251 outputs write signals to the write driver 231 that is connected to the redundant column $118_R$. Further, each shift circuit 251-256 that is downstream from the shift circuit 257 performs the output shift operation in addition to the shift circuit 257 (e.g., the shift circuit identified by the control signal 211). Upstream shift circuits, e.g., the shift circuit 258, does not perform the output shift operation. In one or more examples, each of the shift circuits 251-258 receives the control signal 211 and determines whether or not to perform the output shift operation based on the values of the control signal 211.

The row decoder circuitry 120 includes wordline driver 122. The wordline driver 122 is connected to and drives the wordline $116_1$ to enable (e.g., activate) the wordline, and select the corresponding bitcells for updating the by the write drivers 231-239. As the control signals HW<0> and HW<1> control which of the input/output circuits 261-268 are enabled, the wordline driver 122 directly drives the wordline $116_1$ without any intervening gating circuitry (e.g., logic gates). In an example where the control signal HW<0> indicates that the input/output circuits 261-264 are disabled and the control signal HW<1> indicates that the input/output circuits 261-264 are enabled, the shift circuit 255 provides write signals to the write driver 235, which updates a bitcell within the column $118_3$. The write driver 235 is connected to shift circuits 254 and 255 of both segments 202 and 204, and is accessible to the shift circuit 255 even when the control signal HW<0> indicates that the input/output circuits 261-264 are disabled. Further, as the wordline driver 122 drives the wordlines 116 without input from the control signal HW<0> or the control signal HW<1>, all the bitcells connected to the activated wordline 126 are able to be updated (or read from), regardless of whether or not the control signal HW<0> or the control signal HW<1> indicate that the input/output circuits 261-268 are enabled or disabled. A memory device that uses the control signals HW<0> and HW<1> to gate the input/output circuits 261-268 has a reduced circuit area and manufacturing costs as compared to a memory device that uses the control signals HW<0> and HW<1> to gate the wordline driver 122 output. Further, as the input/output circuits 261-268 are gated, a single redundant column (e.g., column $118_R$) may be used to correct for defect columns in both segments 202 and 204, a single decoder circuitry 210 may be used to control each of the shift circuits 251-258, further reducing the circuit area and manufacturing costs.

Figure 3:
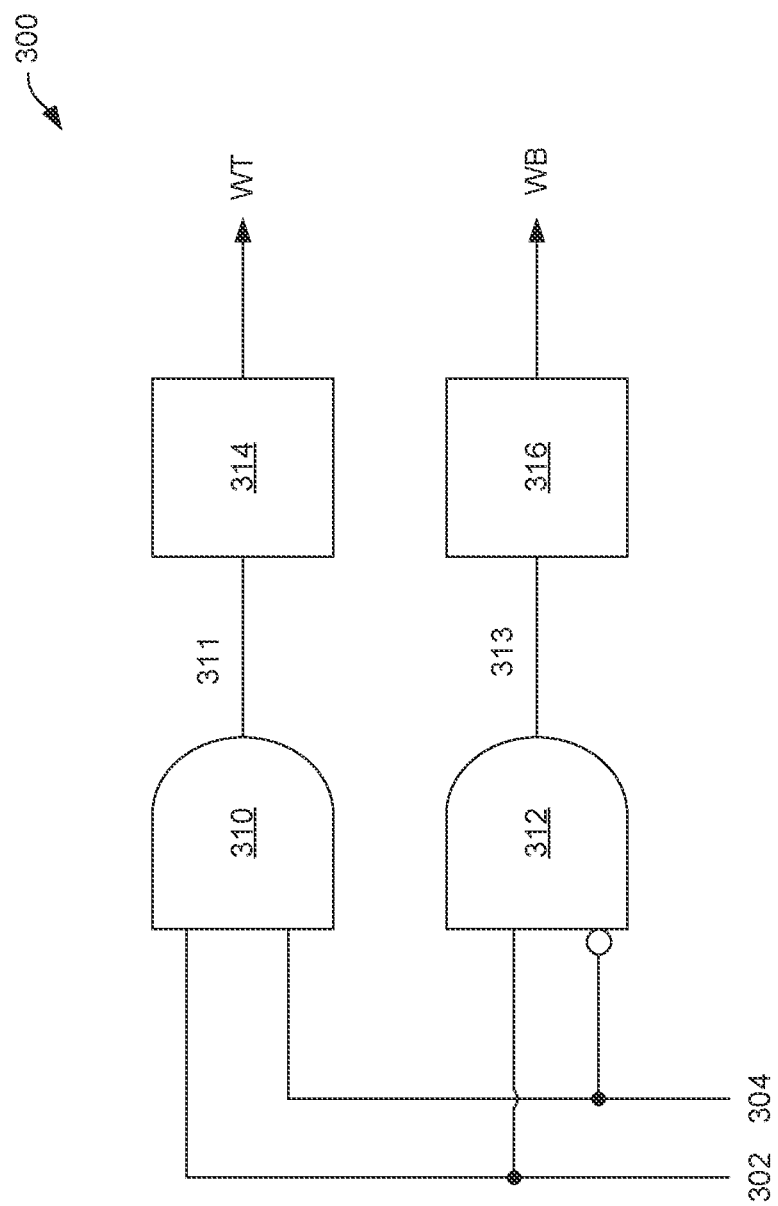
FIG. 3 illustrates a block diagram of an input/output circuit in accordance with some embodiments of the present disclosure.

FIG. 3 illustrates a block diagram of an input/output circuit 300, according to one or more examples. The input/output circuit 300 may be used as any one of the input/output circuits 261-268 of FIG. 2. The input/output circuit 300 includes AND gates 310 and 312, and latch circuits 314 and 316. The AND gate 310 receives the control signal 302 and the data signal 304. With reference to FIG. 2, the control signal 302 is one of the control signal HW<0> and the control signal HW<1>, and the data signal 304 is one of the data signals D0-D7. The output of the AND gate 310 is connected to the latch circuit 314, and the AND gate 312 outputs the signal 313 to the latch circuit 316. The AND gate 310 outputs the signal 311 having a logic value of 1 (e.g., a high voltage value), based on the control signal 302 and the data signal 304 having a logic value of 1. The signal 311 has a logic value of 0 when either of the control signal 302 or the data signal 304 has a logic value of 0.

The AND gate 312 receives the control signal 302 and an inverted data signal 304. The output of the AND gate 312 is connected to the latch circuit 316, and the AND gate 312 outputs the signal 313 to the latch circuit 316. The AND gate 312 outputs the signal 313 having a logic value of 1 (e.g., a high voltage value), based on the control signal 302 and the inverted data signal 304 having a logic value of 1. The signal 313 has a logic value of 0 when either of the control signal 302 or the inverted data signal 304 has a logic value of 0.

As the data signal 304 is inverted before being received by the AND gate 312, when the control signal 302 has a logic value of 1 and the data signal 304 has a logic value of 1, the signal 313 has a logic value of 0, and differs from that of the signal 311 (e.g., the signal 311 has a logic value of 1). Accordingly, the write signals WT and WB output by the latch circuits 314 and 316, respectively, have different values (e.g., the write signal WT has a logic value of 1, and the write signal WB has a write value of 0). Accordingly the corresponding bitcell may be updated to a value of 1 as indicated by the data signal 304. Further, when the control signal 302 has a logic value of 1 and the data signal 304 has a logic value of 0, the signal 313 has a logic value of 1, and differs from that of the signal 311 (e.g., the signal 311 has a logic value of 0). Accordingly, the write signals WT and WB output by the latch circuits 314 and 316 have different values (e.g., the write signal WT has a logic value of 0, and the write signal WB has a write value of 1). Accordingly the corresponding bitcell may be updated a value of 0 as indicated by the data signal 304. When the control signal 302 has a logic value of 0, the signals 311 and 313 and the write signals WT and WB have a logic value of 0. Accordingly, the corresponding bitcells are not updated.

Figure 4:
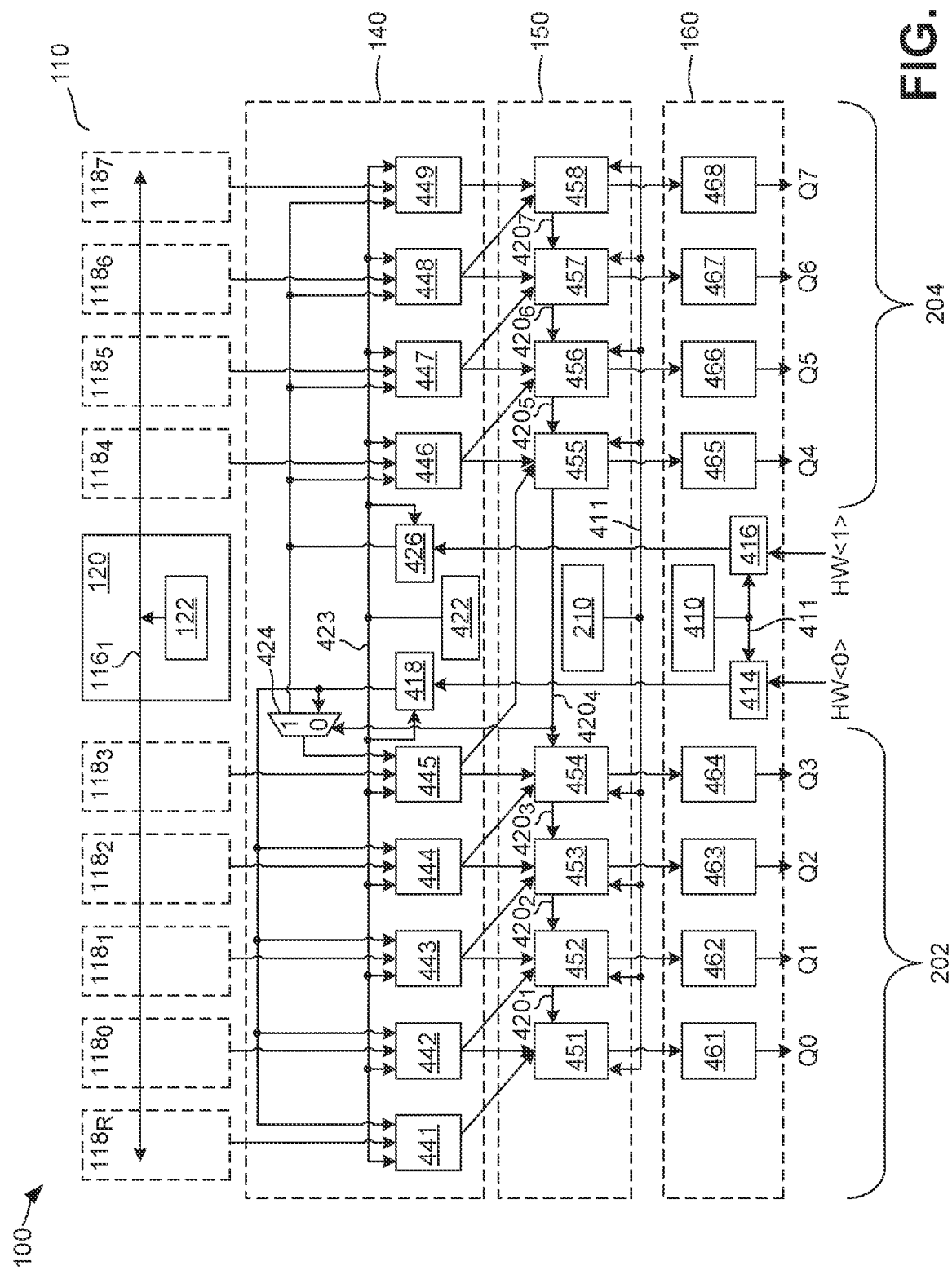
FIG. 4 illustrates a block diagram of a memory device in accordance with some embodiments of the present disclosure.

FIG. 4 illustrates a block diagram of the memory device 100 including the memory array 110, the sense amplifier circuitry 140, the shift control circuitry 150, and the input/output circuitry 160. The sense amplifier circuitry 140 includes sense amplifiers 441-449. The sense amplifiers 441-449 are connected to the columns 118. For example, the sense amplifier 441 is connected to the column $118_R$, the sense amplifier 442 is connected to the column $118_0$, the sense amplifier 443 is connected to the column $118_1$, the sense amplifier 444 is connected to the column $118_2$, the sense amplifier 445 is connected to the column $118_3$, the sense amplifier 446 is connected to the column $118_4$, the sense amplifier 447 is connected to the column $118_5$, the sense amplifier 448 is connected to the column $118_6$, and the sense amplifier 449 is connected to the column $118_7$. In one example, each sense amplifier 441-449 is connected to the corresponding pair of bitlines 114 associated with each column 118, and receives voltages from the corresponding pair of bitlines 114 to read a value of the selected bitcell 112 or bitcells 112.

The shift control circuitry 150 include shift circuits 451-458. Each shift circuit 451-458 is connected to two of the sense amplifiers 441-449. In one example, each shift circuit 451-458 is connected to two adjacent sense amplifiers 441-449. For example, the shift circuit 451 is connected to the sense amplifiers 441 and 442, the shift circuit 452 is connected to the sense amplifiers 442 and 443, the shift circuit 453 is connected to the sense amplifiers 443 and 444, the shift circuit 454 is connected to the sense amplifiers 444 and 445, the shift circuit 455 is connected to the sense amplifiers 445 and 446, the shift circuit 456 is connected to the sense amplifiers 446 and 447, the shift circuit 457 is connected to the sense amplifiers 447 and 448, and the shift circuit 458 is connected to the sense amplifiers 448 and 449.

Each shift circuit 451-458 is connected to an input/output circuit 461-468 of the input/output circuitry 160. Each of the input/output circuits 461-468 receives an output data signal from a respective shift circuit 451-458 and outputs a respective output signal Q0-Q7. In one example, a data signal has a logic value of 0 or 1.

The sense amplifiers 441-445, the shift circuits 451-454, and the input/output circuits 461-464 are associated with segment 202. The sense amplifiers 446-449, the shift circuits 455-458, and the input/output circuits 465-468 are associated with segment 204.

In each segment 202 and 204, each shift circuit 451-458 is connected to an adjacent shift circuit or shift circuits. In the segment 202 the shift circuit 454 is connected to the shift circuit 453, the shift circuit 453 is connected to the shift circuit 452, and the shift circuit 452 is connected to the shift circuit 451. In the segment 204 the shift circuit 458 is connected to the shift circuit 457, the shift circuit 457 is connected to the shift circuit 456, and the shift circuit 456 is connected to the shift circuit 455. Further, the shift circuit 455 is connected to the shift circuit 454, such that shift circuits of the segments 202 and 204 are connected to each other. In one example, the interconnections between shift circuits 451-458 are used to communicate shift control signals 420 between the shift circuits 451-458.

The shift control signals 420 instruct the receiving shift circuit from which sense amplifier to receive data. For example, the shift control signal $420_7$ instructs the shift circuit 457 to receive data from either the sense amplifier 447 or 448. The shift control signal $420_6$ instructs the shift circuit 456 to receive data from either the sense amplifier 446 or 447. The shift control signal $420_5$ instructs the shift circuit 455 to receive data from either the sense amplifier 445 or 336. The shift control signal $420_4$ instructs the shift circuit 454 to receive data from either the sense amplifier 444 or 445. The shift control signal $420_3$ instructs the shift circuit 453 to receive data from either the sense amplifier 443 or 444. The shift control signal $420_2$ instructs the shift circuit 452 to receive data from either the sense amplifier 442 or 443. The shift control signal $220_1$ instructs the shift circuit 451 to receive data from either the sense amplifier 441 or 442.

Further, each shift circuits 451-458 receive the control signal 411 from the decoder circuitry 210. The decoder circuitry 210 determines or includes an indication as to which column 118 is defective and which shift circuit 451-458 is to shift to from receiving data signals from a different write driver. In one example, the control signal 411 is a multi-bit signal. The control signal 411 is determined and configured similar to that of the control signal 211 described above. The bit values within the control signal 411 indicate which shift circuit 451-458 is to shift from receiving data signals from between corresponding write drivers. The indicated shift circuit is the first shift circuit to which input shifting is applied, and the downstream shift circuits are controlled via the shift control signals 420. The decoder circuitry 210 is connected to each of the shift circuits 451-458, and provides a common control signal (e.g., the control signal 411) to each of the shift circuits 451-458.

The sense amplifier circuitry 140 further includes latch circuits 418 and 426, control circuitry 422, and selection circuit 424. Further, the input/output circuitry 160 further includes latch circuits 414 and 416, and latch control circuitry 410. The latch circuit 418 is connected to the latch circuit 414 and the latch circuit 426 is connected to the latch circuit 416.

The latch circuit 414 receives the control signal HW<0> and the latch circuit 416 receives the control signal HW<1> based on the control signal 411 output by the latch control circuitry 410. The latch control circuitry 410 outputs the control signal 411 to control whether or not the latch circuit 414 latches and outputs the control signal HW<0> and the latch circuit 416 latches and outputs the control signal HW<1>.

The latch circuit 414 outputs the latched control signal HW<0> and the latch circuit 418 latches the control signal HW<0> based on the latched control signal 423 output from the control circuitry 422. The latch circuit 416 outputs the latched control signal HW<1> and the latch circuit 426 latches the latched control signal HW<1> based on the control signal 423 output from the control circuitry 422.

The control circuitry 422 further outputs the control signal 423 to each of the sense amplifiers 441-449. The control signal 423 provides an indication to the sense amplifiers 441-449 to obtain (e.g., receive) data from a corresponding bitcell of a corresponding column 118. The control signal 423 enables or disables the sense amplifiers 441-449. The control signal 423 is generated based on the control circuitry 4 to determine when the sense amplifiers 441-449 are to be enabled.

Each of the sense amplifiers 441-444 receive the control signal HW<0> latched and output from the latch circuit 418. Further, the sense amplifiers 446-449 receive the control signal HW<1> latched and output from the latch circuit 418. The control signal HW<0> enables or disables the sense amplifiers 441-444 and the control signal HW<1> enables or disables the sense amplifiers 446-449. The sense amplifier 445 is connected to the output of the selection circuit 424. The selection circuit 424 can be a multiplexer or another type of selection circuitry. The selection circuit 424 receives the control signal HW<1> from the latch circuit 426 at a first input and the control signal HW<0> from the latch circuit 418 at a second input. Further, the selection circuit 424 receives the shift control signal $420_4$ as a selection control signal. The shift control signal $420_4$ controls whether the selection circuit 424 outputs the control signal HW<0> or the control signal HW<1>. In one example, based on the shift control signal $420_4$ providing an indication to perform a shift operation (e.g., having a logic value 1), the selection circuit 424 outputs the control signal HW<1>, and based on the shift control signal $420_4$ providing an indication to not perform a shift operation (e.g., having a logic value of 0), the selection circuit 424 outputs the control signal HW<0>. Accordingly, in an example where the shift circuit 455 obtains data from the sense amplifier 445 instead of the sense amplifier 446 (e.g., a shift operation is applied to the shift circuit 454), the sense amplifier 445 is controlled by the control signal HW<1> and outputs data to the shift circuit 455. In such an example, even when the control signal HW<0> disables the sense amplifiers 441-444, the shift circuits 451-454, and the input/output circuits 461-464. Further, in an example where the shift circuit 455 obtains data from the sense amplifier 446, the sense amplifier 445 is controlled by the control signal HW<0> and outputs data to the shift circuit 454.

In one example, the column $118_6$ is determined to be defective during testing, and a corresponding indication is stored within a memory and/or within the decoder circuitry 210. The decoder circuitry 210 generates and outputs the control signal 411 to the shift circuits 451-457 indicating that the shift circuit 457 is to shift receiving data signals from the sense amplifier 448 to the sense amplifier 447. The shift circuit 457 receives the control signal 411 and determines from the bit values of the control signal 411 to shift receiving data signals from the sense amplifier 448 to the sense amplifier 447. Further, the shift circuit 457 outputs the shift control signal $420_6$ having an indication for the shift circuit 456 to shift receiving data signals from the sense amplifier 447 to the sense amplifier 446. The shift circuit 457 sets the shift control signal $420_6$ to a logic value of 0 or 1 to provide an indication for the shift circuit 456 to shift receiving data signals from the sense amplifier 447 to the sense amplifier 448.

Based on the shift control signal $420_6$ including an indication to perform the output shift operation, the shift circuit 456 shifts to receive data signal from the sense amplifier 446, and sets the shift control signal $420_5$ to a logic value of 0 or 1 to provide an indication for the shift circuit 455 to shift receiving data signals from the sense amplifier 446 to the sense amplifier 445. Based on the shift control signal $420_5$ including an indication to perform the output shift operation, the shift circuit 455 shifts to receive data signal from the sense amplifier 445, and sets the shift control signal 420₄ to a logic value of 0 or 1 to provide an indication for the shift circuit 454 to shift receiving data signals from the sense amplifier 445 to the sense amplifier 444. Based on the shift control signal 420₄ including an indication to perform the output shift operation, the shift circuit 454 shifts to receive data signal from the sense amplifier 444, and sets the shift control signal 420₃ to a logic value of 0 or 1 to provide an indication for the shift circuit 453 to shift receiving data signals from the sense amplifier 444 to the sense amplifier 443. Based on the shift control signal 420₃ including an indication to perform the output shift operation, the shift circuit 453 shifts to receive data signal from the sense amplifier 443, and sets the shift control signal 420₂ to a logic value of 0 or 1 to provide an indication for the shift circuit 452 to shift receiving data signals from the sense amplifier 443 to the sense amplifier 442. Based on the shift control signal 420₂ including an indication to perform the output shift operation, the shift circuit 452 shifts to receive data signal from the sense amplifier 442, and sets the shift control signal 420₁ to a logic value of 0 or 1 to provide an indication for the shift circuit 451 to shift receiving data signals from the sense amplifier 442 to the sense amplifier 441. Based on the shift control signal 420₁ including an indication to perform the output shift operation, the shift circuit 451 shifts to receive data signal from the sense amplifier 441.

In the above example, the shift circuit 451 obtains data signals from the sense amplifier 441 that is connected to the redundant column 118$_R$. Further, each shift circuit 451-456 that is downstream from the shift circuit 457 performs the output shift operation in addition to the shift circuit 457 (e.g., the shift circuit identified by the control signal 411). Upstream shift circuits, e.g., the shift circuit 458, do not perform the output shift operation. In one or more examples, each of the shift circuits 451-458 receives the control signal 411 and determines whether or not to perform the output shift operation based on the values of the control signal 411.

The control signals HW<0> and HW<1> (e.g., bits of the control signal HW<0:1>) control which of the sense amplifiers 441-449 are enabled, the wordline driver 122 directly drives the wordline 116₁ without any intervening gating circuitry (e.g., logic gates). Additionally, a single decoder circuitry (e.g., the decoder circuitry 210) generates a control signal 411 for the shift circuits 451-454 and 455-458 of both segments 202, 204. Further, as the sense amplifier is controlled by either of the control signals HW<0> and HW<1> based on whether or not a shift operation is performed by the shift circuit 455, the sense amplifier 445 is connected to shift circuits 454 and 455 of both segments 202 and 204, and is accessible to the shift circuit 455 even when the control signal HW<0> indicates that the sense amplifiers 441-444 are disabled. Further, as the wordline driver 122 drives the wordlines 116 without input from the control signal HW<0> or the control signal HW<1>, all the bitcells connected to the activated wordline 116 are able to be read from regardless of whether or not the control signal HW<0> or the control signal HW<1> indicate that the input/output circuits 461-468 are enabled or disabled.

In the memory device 100, the shift circuit 455 receives data signals from sense amplifiers and columns within both segments 202 and 204. Further, the control signals HW<0> and HW<1> gate the sense amplifiers 441-449 and a single column (e.g., column 118$_R$) is used for column redundancy. To support a shift circuit 455 that receives data signals from a sense amplifier in segment 202 or 204, the sense amplifier 445 that is connected to shift circuits in different segments 202 and 204 (e.g., the shift circuit 454 and the shift circuit 455), is gated via the selection circuit 424. The selection circuit 424 gates the sense amplifier based on one of the control signals HW<0> and HW<1>. Accordingly, the sense amplifier 445 is enabled even when the control signal HW<0> disables the sense amplifiers 441-444. As the memory device 100 gates the sense amplifiers 441-449 and uses a single redundant column (e.g., the column 118$_R$), the memory device 100 has a reduced circuit area and complexity as compared to a memory device that uses multiple columns for column redundancy and applies gating to the driven wordlines, reducing the manufacturing cost of the memory device 100.

For ease of explanation, the sense amplifier circuitry 140 is omitted from FIG. 2 and the corresponding description, and the write driver circuitry 130 is omitted from FIG. 4 and the corresponding description. As is illustrated in FIG. 1, the memory device 100 includes both the write driver circuitry 130 and the sense amplifier circuitry 140 as illustrated FIGS. 2 and 4 and described in corresponding description. Further, the shift control circuitry 150 includes both the shift circuits 251-258 as illustrated in FIG. 2 and the shift circuits 451-458 as illustrated in FIG. 4, and the input/output circuitry 160 includes the input/output circuits 261-268 of FIG. 2 and the input/output circuits 461-468 of FIG. 4.

Figure 5:
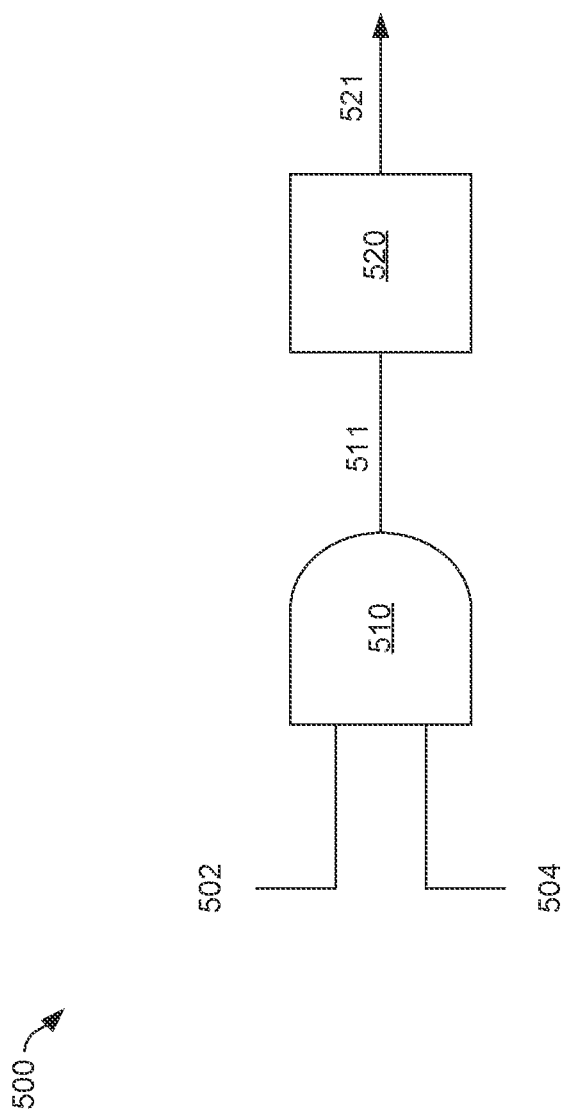
FIG. 5 illustrates a block diagram of a sense amplifier in accordance with some embodiments of the present disclosure.

FIG. 5 illustrates a block diagram of an example sense amplifier 500, according to one or more examples. The sense amplifier 500 may be used by any one or more of the sense amplifiers 441-449 of FIG. 4. The sense amplifier 500 includes AND gate 510 and sense-amplifier-latch circuit 520. The AND gate 510 receives the control signal 502 and the control signal 504. With reference to FIG. 4, the control signal 502 is one of the control signal HW<0> and HW<1> (e.g., a bit of the control signal HW<0:1>), and the control signal 504 is the control signal 423. The AND gate 510 outputs the signal 511 based on the values of the control signals 502 and 504. For example, based on the control signals 502 and 504 having a value of logic 1, the signal 511 has a value of logic 1, and the sense amplifier 500 is enabled. The signal 511 has a value of logic 0 based on either of the control signals having a value of logic 0. The latch circuit 520 latches the signal 511 and outputs the signal 521 having the value of the signal 511. In one example, when the control signal 502 has a logic value of 0, the signal 521 has logic value of 0, and the sense amplifier 500 is disabled. Further, when the control signal 504 has a logic value of 0, the signal 521 has logic value of 0, and the sense amplifier 500 is disabled. Accordingly, with reference to FIG. 4 when the control signal 423 and the control signal HW<0> or HW<1> have a logic of 0, the sense amplifier 500 is disabled. Further, when both the control signal 423 and the control signal HW<0> or HW<1> have a logic of 1, the sense amplifier 500 is enabled.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A memory device comprising:
   a memory array comprising bitcells and bitlines connected to the bitcells, wherein the bitcells are grouped into bitcell groups; and
   a control circuitry connected to the bitcell groups via the bitlines, and configured to, based on a half-word control signal being enabled, adjust connections with the bitcell groups to include a first bitcell group of the bitcell groups in memory operations and exclude a second bitcell group of the bitcell groups from the memory operations.

2. The memory device of claim 1, wherein the control circuitry comprises:
   a write driver circuitry comprising write drivers connected to the bitlines;
   a shift control circuitry comprising first shift circuits connected to the write drivers, wherein each of the first shift circuits is configured to output write signals to two of the write drivers; and
   an input/output circuitry comprising input/output circuits, each input/output circuit is connected to a respective one of the first shift circuits, and wherein the output of each input/output circuit is gated based on the half-word control signal.

3. The memory device of claim 2, wherein the input/output circuits are configured to output write signals based on the half-word control signal being enabled and a data signal.

4. The memory device of claim 2, wherein the first shift circuits are interconnected and configured to output shift control signals between the first shift circuits, wherein the shift control signals indicate which write driver of the write drivers to output write signals.

5. The memory device of claim 2, wherein the control circuitry further comprises a decoder circuitry connected to the first shift circuits and configured to output a control signal to each of the first shift circuits that provides an indication to one of the first shift circuits to shift outputting write signals from a first write driver of the write drivers to a second write driver of the write drivers.

6. The memory device of claim 2, wherein the control circuitry further comprises:
   a sense amplifier circuitry comprising sense amplifiers, each of the sense amplifiers is coupled to the bitlines, and configured to receive data from the bitlines, wherein the shift control circuitry includes second shift circuits coupled to the sense amplifiers, and wherein outputting data signals from the sense amplifiers to the second shift circuits is gated based on the half-word control signal.

7. The memory device of claim 6, wherein the sense amplifier circuitry further comprises a selection circuit, the selection circuit is configured to output a first bit of the half-word control signal or a second bit of the half-word control signal to a first sense amplifier of the sense amplifiers based on a shift control signal output from a second sense amplifier of the sense amplifiers.

8. The memory device of claim 6, wherein the control circuitry further comprises a decoder circuitry connected to the second shift circuits and configured to output a control signal to each of the second shift circuits that provides an indication to one of the second shift circuits to shift receiving data signals from a first sense amplifier of the sense amplifiers to a second sense amplifier of the sense amplifiers.

9. The memory device of claim 6, wherein the second shift circuits are interconnected and configured to output shift control signals between the second shift circuits, wherein the shift control signals indicate which sense amplifier of the sense amplifiers to receive data signals.

10. The memory device of claim 6, wherein each of the sense amplifiers is configured to output a data signal based on the half-word control signal and a sense amplifier enable signal.

11. A control circuitry comprising:
    a shift control circuitry configured to, based on a half-word control signal being enabled, adjust connections between the control circuitry and bitcells groups of a memory array to include a first bitcell group of the bitcell groups in memory operations and exclude a second bitcell group of the bitcell groups from the memory operations, wherein the memory array comprises bitlines connected to bitcells of the bitcells groups.

12. The control circuitry of claim 11 further comprising:
    a write driver circuitry comprising write drivers connected to the bitlines; and
    an input/output circuitry comprising input/output circuits, each input/output circuit is connected to a respective one of first shift circuits of the shift control circuitry, wherein the output of each input/output circuit is gated based on the half-word control signal, and wherein the first shift circuits are connected to the write drivers, and wherein each of the first shift circuits is configured to output write signals to two of the write drivers.

13. The control circuitry of claim 12, wherein a the input/output circuits are configured to output write signals based on the half-word control signal being enabled and a data signal.

14. The control circuitry of claim 12, wherein the first shift circuits are interconnected and configured to output shift control signals between the first shift circuits, wherein the shift control signals indicate which write driver of the write drivers to output write signals.

15. The control circuitry of claim 12, wherein the control circuitry further comprises a decoder circuitry connected to the first shift circuits and configured to output a control signal to each of the first shift circuits that provides an indication to one of the first shift circuits to shift outputting write signals from a first write driver of the write drivers to a second write driver of the write drivers.

16. The control circuitry of claim 12, wherein the control circuitry further comprises:
    a sense amplifier circuitry comprising sense amplifiers, each of the sense amplifiers is coupled to the bitlines, and configured to receive data from the bitlines, wherein the shift control circuitry includes second shift circuits coupled to the sense amplifiers, and wherein outputting data signals from the sense amplifiers to the second shift circuits is gated based on the half-word control signal.

17. The control circuitry of claim 16, wherein the sense amplifier circuitry further comprises a selection circuit, the selection circuit is configured to output a first bit of the half-word control signal or a second bit of the half-word control signal to a first sense amplifier of the sense amplifiers based on a shift control signal output from a second sense amplifier of the sense amplifiers.

18. The control circuitry of claim 16, further comprising a decoder circuitry connected to the second shift circuits and configured to output a control signal to each of the second shift circuits that provides an indication to one of the second shift circuits to shift receiving data signals from a first sense amplifier of the sense amplifiers to a second sense amplifier of the sense amplifiers.

19. The control circuitry of claim 16, wherein each of the sense amplifiers is configured to output a data signal based on the half-word control signal and a sense amplifier enable signal.

20. A memory device comprising:
- a memory array comprising bitcells and bitlines connected to the bitcells;
- a control circuitry connected the memory array and comprising:
  - a write driver circuitry comprising write drivers connected to the bitlines;
  - a sense amplifier circuitry comprising sense amplifiers, each of the sense amplifiers is coupled to the bitlines, and configured to receive data from the bitlines;
  - a shift control circuitry comprising:
    - first shift circuits connected to the write drivers, wherein each of the first shift circuits is configured to output write signals to two of the write drivers; and
    - second shift circuits connected to the sense amplifiers, wherein the sense amplifiers are gated based on a half-word control signal to control outputting data signals to the second shift circuits; and
  - an input/output circuitry comprising input/output circuits, each input/output circuit is connected to a respective one of the first shift circuits, and wherein the output of each input/output circuit is gated based on the half-word control signal.

* * * * *